US005107234A

United States Patent [19]

Ehrmann-Falkenau et al.

[11] Patent Number: 5,107,234

[45] Date of Patent: Apr. 21, 1992

[54] SURFACE-WAVE FILTER WITH SELECTIVELY CONNECTABLE TRACKS TO PROVIDE A VARIABLE TRANSMISSION BAND

[75] Inventors: Ekkeh Ehrmann-Falkenau; Karlheinz Rott, both of Munich; Wilfried Schott, Germering; Peter Zibis, Munich, all of Fed. Rep. of Germany

[73] Assignee: Siemens Aktiengesellschaft, Munich, Fed. Rep. of Germany

[21] Appl. No.: 435,810

[22] Filed: Nov. 13, 1989

[30] Foreign Application Priority Data

Nov. 11, 1988 [EP] European Pat. Off. ........ 88118879.1

[51] Int. Cl.[5] ........ H03H 9/64

[52] U.S. Cl. ........ 333/195; 310/313 R

[58] Field of Search ........ 333/193-196, 333/152; 310/313 R, 313 B, 313 C, 313 D

[56] References Cited

U.S. PATENT DOCUMENTS

| | | | |
|---|---|---|---|
| 3,745,564 | 7/1973 | Gandolfo et al. | 310/313 R X |
| 4,178,571 | 12/1979 | Mitchell | 333/196 X |
| 4,764,701 | 8/1988 | Garbacz et al. | 310/313 R |
| 4,803,449 | 2/1989 | Hikita et al. | 310/313 R X |

FOREIGN PATENT DOCUMENTS

| | | |
|---|---|---|
| 65150 | 11/1982 | European Pat. Off. . |
| 2132985 | 1/1973 | Fed. Rep. of Germany . |
| 1512790 | 6/1978 | United Kingdom . |

OTHER PUBLICATIONS

"Surface Acoustic-Wave Devices", pp. 1-4, vol. 18, McGraw-Hill Encyclopedia of Science and Technology, 6th Edition.

*Primary Examiner*—Eugene R. LaRoche
*Assistant Examiner*—Benny Lee
*Attorney, Agent, or Firm*—Hill, Van Santen, Steadman & Simpson

[57] ABSTRACT

A surface-wave filter that has a variable transmission band is formed of at least two parallel tracks having input and output transducers whereby the bus-bars of one transducer of one track lie at two different potentials and one bus-bar of one transducer of a further track lies at one of the two potentials. The other bus-bar is selectively connectable to the other of these potentials so that the transducer of the further track is selectively enabled or disabled. Since the tracks have different transmissions bands, the transmission band of the filter is thus, selectable by connecting and disconnecting the further track.

13 Claims, 2 Drawing Sheets

1
EW1
EW2
AW1
AW2
A
B
S
TERMINAL
TERMINAL
TERMINAL
TERMINAL
TERMINAL
TERMINAL
2
3
4
5
6
7
8
9
10
11
12
13
14
15
16
17
18
19
20
21

A

B

A+ B

SURFACE-WAVE FILTER WITH SELECTIVELY CONNECTABLE TRACKS TO PROVIDE A VARIABLE TRANSMISSION BAND

BACKGROUND OF THE INVENTION

1. Field of the Invention

The present invention relates generally to a surface-wave filter, and more particularly, to a surface-wave filter which can be switched to different transmission bands.

2. Description of the Related Art

Surface-wave filters are known, for example, from the data book, "Oberflaechenwellenfilter fuer Fernsehanwendungen", Datenbuch 1987/1988, published by Siemens AG. Surface-wave filters generally are integrated, passive components having band-pass filter characteristics. Surface-wave filters function based on the interference of mechanical surface waves that propagate along the surface of a piezo-electric material. The structure of surface-wave filters is characterized by a single-crystal, piezo-electric substrate, preferably a lithium niobate substrate, onto which a metal layer, normally an aluminum layer, is applied, for example, by vapor deposition. Piezo-electric input and output transducers, also referred to as interdigital transducers, are formed from this metal layer by, for example, by photo etching techniques.

The interdigital transducers are composed of a plurality of metallic, comb-like electrodes. More specifically, the electrodes each have a bus-bar as its base with fingers extending perpendicularly from the bus-bar and overlapping with like fingers of another comb-like electrode of a different polarity in an active region of each of the transducers. The substrate per se is fastened on a metal carrier. Bond wires provide the contact for the input and output transducers to terminals or pins leading to the outside.

During operation of surface-wave filters, an electrical signal which is input to the transducer is converted into a mechanical surface wave that runs along the surface of, or in a surface-proximate layer of, the substrate to an output transducer. The output transducer, in turn, converts the surface wave into an electrical signal. Standard transducers have interdigital structures with transit time effects and are distinguished by highly frequency-dependent properties so that, by appropriate formation of the finger structures of the transducers, a filter effect (i.e. the transmission band) for electrical signals is achieved.

The filter effect of the surface-wave filters is thereby essentially determined by the transmission loss, or transmission curve, which defines the transmission band. The transmission loss is the attenuation of the transmitted signal over the frequency and is at a minimum in the filter transmission band. Given a known single-crystal substrate, and assuming that the fundamental structure of the filter, such as the type and position of the transducers as well as the utilization of further components suitable for signal processing of surface waves, is fixed, then the transmission band of the filter can be varied only by modifying the internal structure of one or both transducers. For example, the finger spacing, the finger aperture or the weight of the transducer fingers can be varied to achieve variation of the transmission band. Of course, it may also be possible to vary the transmission band on the basis of external wiring of the filter.

In certain instances, for example, in multi-standard television receivers in which, for example, television transmissions that are based on some other standard, such as the I-standard, the L-standard or the M-standard, can be received in addition to PAL television transmissions, an IF filter having a transmission band corresponding to the standard is required. This also applies to NTSC transmissions. The user, or possibly even the manufacturer of the television receiver, switches to the corresponding IF filter, or selects from the possible standards, depending upon the standard being received. Included among the possible filters are what are known as double video filters having two video channels with different video bandwidths and each having two inputs and two outputs. The user alternately switches to one or the other of these two channels.

SUMMARY OF THE INVENTION

An object of the present invention is to provide a single, switchable surface-wave filter in place of the relatively large number of filters having different transmission bandwidths which have previously been required at a considerable expense, and thereby to considerably reduce the expense of providing filters.

These and other objects and advantages of the invention are achieved with a surface-wave filter, also known as a surface acoustic wave filter, having at least two parallel tracks with input and output transducers, whereby bus-bars of an input or output transducer of one track lie at different potentials and a bus-bar also of a transducer of another track is optionally connectable to one of these potentials, so that the resulting transmission band of the filter is selectable by connecting and disconnecting the individual tracks, each of which has a different transmission band.

For example, when switching is to be undertaken between two transmission bands, then two parallel tracks of different transmission characteristics are adequate. The first of these two tracks has the bus-bars of either the input transducer or the output transducer lying at different potentials and thus being operable. One bus-bar of either the input or the output transducer of the second track lies at one of the two potentials while the other bus-bar is selectively connectable to and disconnectable from the other potential. This enables the second track to be made operable or inoperable, as desired, thus changing the transmission band characteristics of the filter. This principle is also applicable to filters having more than two tracks.

Also according to the invention, the output transducers of the tracks may be either connected in parallel or in series.

DETAILED DESCRIPTION OF THE RELATED ART

Figure 1:
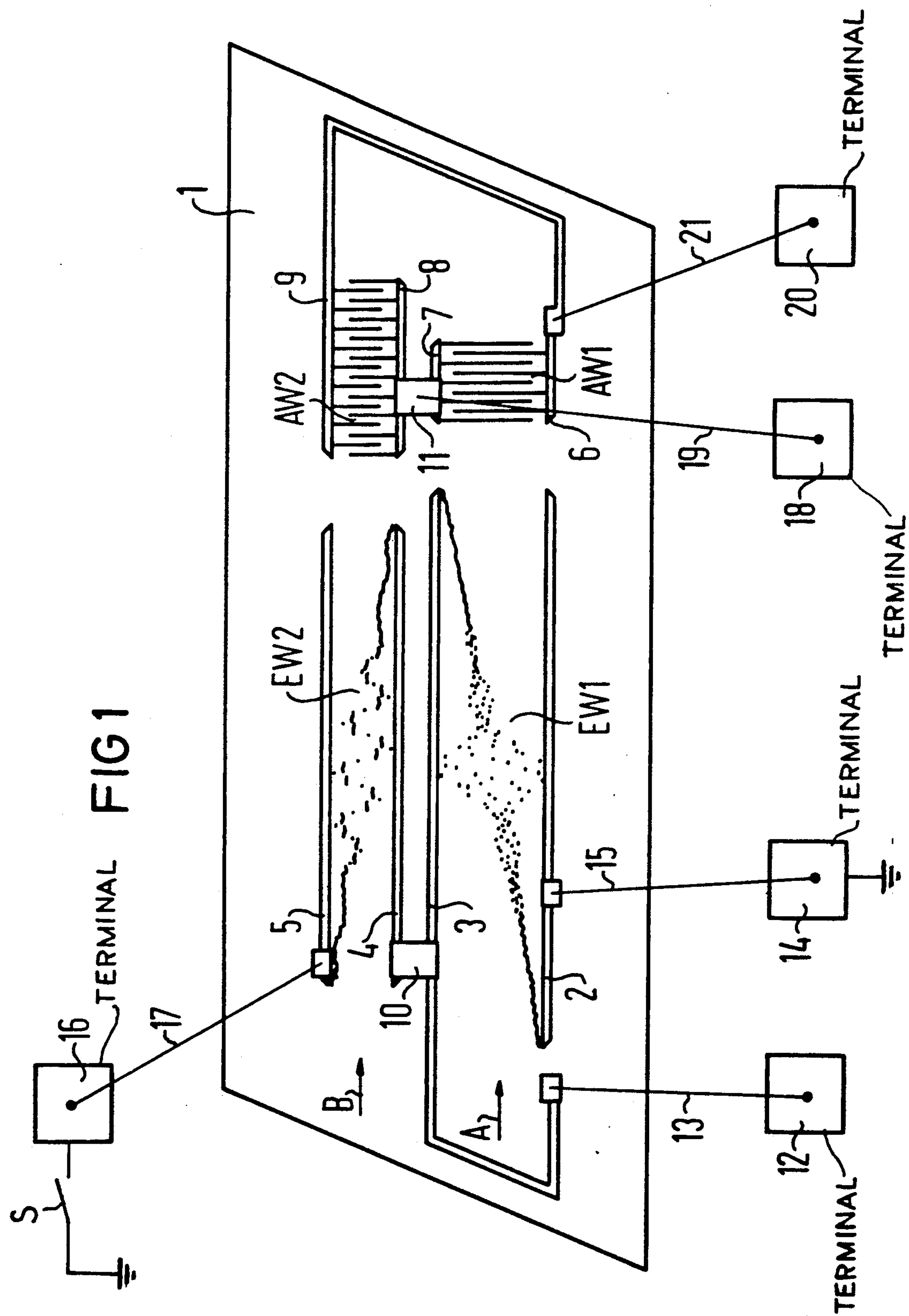
FIG. 1 is a schematic plan view of a surface-wave filter according to the principles of the present invention.

A surface-wave filter, also known as a surface acoustic wave filter, is shown in FIG. 1 formed on a single crystal, piezo-electric substrate 1, which is preferably a lithium niobate substrate. On the surface of the substrate is formed two parallel tracks A and B having different signal transmission characteristics. Each track A and B has a respective input transducer EW1 and EW2 of an interdigital structure of comb-like electrodes overlapping one another to produce mechanical surface waves in the substrate 1. The illustrated input transducers obtain their frequency characteristics from a technique known as apodization in which the overlap between adjacent electrode fingers is varied. The envelope defined by the apodized transducer electrodes is shown schematically in FIG. 1. The track A also includes bus-bars 2 and 3, while track B has bus-bars 4 and 5 for the interdigital electrodes. The bus-bars, 3 and 4, are electrically connected to one another by a linkage 10.

Input terminals are provided, including an input side terminal 12 connected to the bus-bar 3 by a bond wire 13 and a second input side terminal 14 connected to the bus-bar 2 by a bond wire 15. The bus-bar 5 is connected via a bond wire 17 to a terminal 16 which serves as a switchable circuit input.

Output transducers AW1 and AW2 are also of an interdigital configuration and are shown in FIG. 1 formed of overlapped fingers of comb-like electrodes, the output transducers AW1 and AW2 being connected in parallel in the illustrated exemplary embodiment. To this end, bus-bars 7 and 8 of the output transducers AW1, and AW2 are connected to one another via a linkage contact 11 which is connected to a terminal 18 via a bondwire 19. The output transducers AW1 and AW2 also have bus-bars 6 and 9, which are connected to one another and connected to a terminal 20 via a bond wire 21.

Figure 2A:
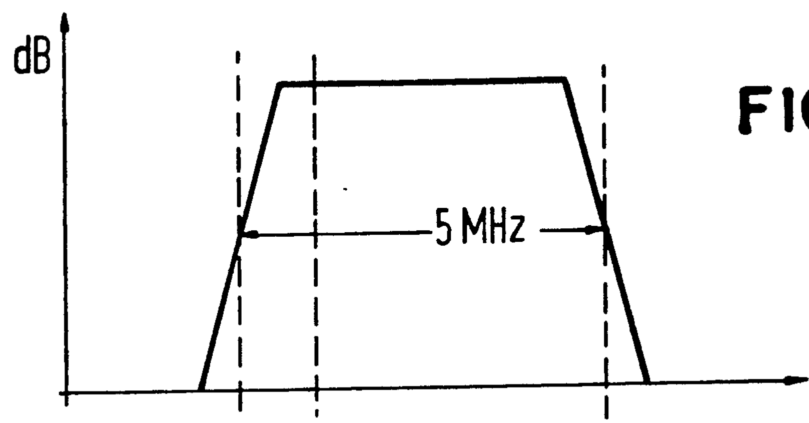
FIG. 2a is a frequency transmission curve of a first track of the filter of FIG. 1.
Figure 2B:
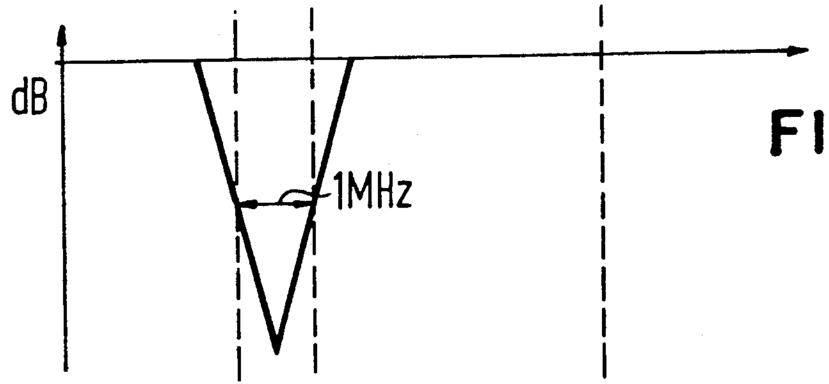
FIG. 2b is a frequency transmission curve of a second of the two tracks of FIG. 1.
Figure 2C:
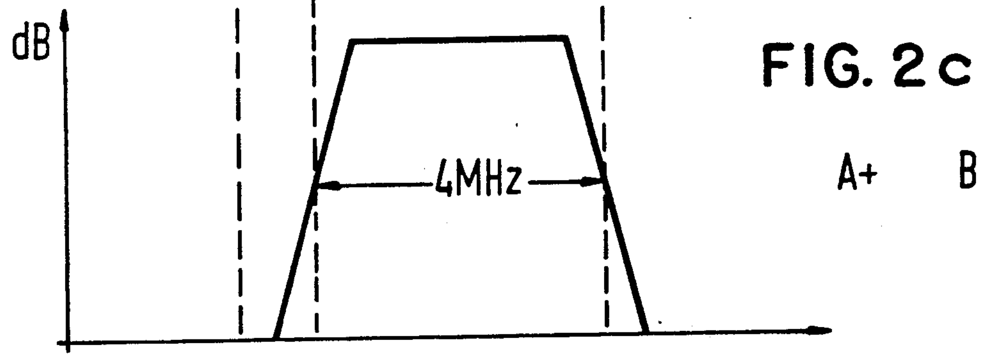
FIG. 2c is a frequency transmission curve of the overall filter of FIG. 1 with both tracks operating.

The filter of FIG. 1 is a switchable video filter which may be used as an IF-filter in a multi-standard television receiver. This filter is switchable to the transmission band which corresponds to the desired operating standard. The operation of the filter of FIG. 1 shall be set forth below with reference to FIGS. 2*a*, 2*b* and 2*c*. In the filter of FIG. 1, the first track A is designed for a transmission band (shown in FIG. 2*a*) that is greater than the transmission band of the second track B (shown in FIG. 2*b*). When a signal with a greater bandwidth is transmitted in track A, such as, for example, a signal having a bandwidth of 5 MHz which corresponds to the video bandwidth of the European B/G-standard, and a difference signal having a bandwidth of 1 MHz relative to the 4 MHz bandwidth standard of the M-standard is transmitted in the second track B, then a corresponding signal that is 4 MHz wide (shown in FIG. 2*c*) is obtained at the filter output. A prerequisite for this to happen is that the tracks A and B are electrically active, in other words, the bus-bars 3 and 4 of the input transducers EW1 and EW2 lie at a higher potential and the bus-bars 2 and 5 lie at a lower potential, usually at ground. Due to the parallel connection of the two output transducers AW1 and AW2, the signals of both tracks A and B add up in this fashion.

The presence of the additional, external terminal 16 for the bus-bar 5 permits the bus-bar 5 to be selectively disconnected from the lower potential, so that the second track B no longer is operative. Thus, such as by a switch means S, when only the first input transducer EW1 is activated, in other words when the bus-bar 5 does not lie at the same potential as the bus-bar 2, only the signal having the greater bandwidth, for example 5 MHz., is transmitted. The present filter is thereby switchable between different transmission bandwidths.

The same effect, namely selectively disabling one of the tracks, can also be accomplished by disabling the output transducer AW2 for the corresponding track. For example, the arrangement of FIG. 1 has the bus-bars 2 and 5 connected to one another so that both are at the same potential and both input transducers EW1 and EW2 are always electrically active.

At the output side, however, the bus-bars 6 and 9 are each connected to their own respective external terminals instead of being connected in common. This permits the bus-bar 9, for example, to be selectively connected and disconnected to its operating potential, for example ground.

It is within the scope of the present invention to provide additional bandwidth selection possibilities by adding further tracks to the present filter. It is also within the realm of possibilities for the present invention to connect the output transducers of the two tracks in series instead of in parallel. One contemplated application for the present filter is for use as an IF-filter for multi-standard television receivers such that the IF-filter is switchable into the corresponding transmission band depending upon the desired standard.

Although other modifications and changes may be suggested by those skilled in the art, it is the intention of the inventors to embody within the patent warranted hereon all changes and modifications as reasonably and properly come within the scope of their contribution to the art.

We claim:

1. A surface-wave filter having a variable transmission band, comprising:

a piezo-electric substrate;

at least two parallel tracks, having mutually different transmission bands, formed on said substrate, each of said at least two parallel tracks comprising an input and output transducer, each of said transducers having first and second bus-bars, said first and second bus-bars of one of said transducers of a first of said tracks being at mutually different potentials, a first of said bus-bars of one of said transducers of a second of said tracks being at one of said mutually different potentials;

means for selectively connecting a second of said bus-bars of said one of said transducers of said second of said tracks to a second of said different potentials so that a transmissions band of said filter is selectively variable by connecting and disconnecting said second of said bus-bars.

2. A surface-wave filter as claimed in claim 1, wherein said at least two parallel tracks are only two parallel tracks, and said means for selectively connecting selectively connects one of said bus bars of said input transducer of a second of said two tracks.

3. A surface-wave filter as claimed in claim 2, wherein said output transducers of said two tracks are electrically connected in series.

4. A surface-wave filter as claimed in claim 2, wherein said output transducers of said two tracks are electrically connected in parallel.

5. A surface-wave filter as claimed in claim 1, wherein said at least two parallel tracks are only two tracks, and said means for selectively connecting selectively connects one of said bus bars of said output transducer of said second track.

6. A surface-wave filter as claimed in claim 5, wherein said output transducer of said two tracks are electrically connected in parallel.

7. A surface-wave filter as claimed in claim 3, wherein said output transducers of said two tracks are electrically connected in series.

8. A surface-wave filter as claimed in claim 1, wherein said filter is used as a IF-filter for multi-standard television receivers and said IF-filter is switchable to corresponding transmission bands depending on a desired standard by said connecting and disconnecting of said second of said bus-bars to said second of said two different potentials.

9. A surface-wave filter that is switchable between at least two transmission band distinguished by mutually different transmission frequency characteristics, comprising:

a piezo-electric substrate;

a first track formed on said substrate and operable at a first transmission band, said first track including:

an input transducer of interdigital electrodes having first and second bus-bars;

an output transducer of interdigital electrodes having third and fourth bus-bars;

an external connection terminal to said first bus-bar, an external connection terminal to said second bus-bar;

a second track formed on said substrate parallel to said first track, said second track being operable to transmit a second transmission band which is different than said first transmission band, said second track including:

an input transducer of interdigital electrodes having first and sixth bus-bars, an output transducer of interdigital electrodes having seventh and eighth bus-bars, an internal connection between said fifth bus-bar of said second track and said second bus-bar of said first track, an external connection terminal to said sixth bus-bar; and switch means connected to said external connection terminal of said sixth bus-bar for selectively connecting said sixth bus-bar to an operating potential for simultaneous operation of said input transducers of said first and second tracks and for selectively disconnecting said sixth bus-bar from said operating potential so that said input transducer of said second track in inoperable during operation of said input transducer of said first track so that said filter is switchable between said two transmission bands.

10. A surface-wave filter as claimed in claim 9, further comprising:

an internal connection between said third and eighth bus-bars, and an internal connection between said fourth and seventh bus-bars.

11. A surface-wave filter as claimed in claim 10, further comprising:

an external connection to said third bus-bar, and an external connection to said fourth bus-bar so that said output transducers of said first and second tracks are electrically connected in parallel.

12. A surface-wave filter as claimed in claim 10, further comprising:

an external connection to only one of said third and fourth bus-bars so that said output transducers of said first and second tracks are electrically connected in series.

13. A surface-wave filter that is switchable between at least two transmission bands distinguished by mutually different transmission frequency characteristics, comprising:

a piezo-electric substrate;

a first track formed on said substrate and operable to transmit a first transmission band, said first track including:

an input transducer of interdigital electrodes having first and second bus-bars, an output transducer of interdigital electrodes having third and fourth bus-bars, an external connection to said third bus-bar, an external connection to said fourth bus-bar, a second track formed on said substrate and operable at a second transmission band which is different than said first transmission band, said second track including:

an input transducer of interdigital electrodes having fifth and sixth bus-bars, an output transducer of interdigital electrodes having seventh and eighth bus-bars, an internal connection between said fourth bus-bar and said seventh bus-bar, and an external connection terminal to said eighth bus-bar; and switch means for connecting said eighth bus-bar to an operating potential for simultaneous operation of said output transducers of said first and second tracks and for disconnecting said eighth bus-bar from said operating potential so that said output transducer of said second track is inoperable during operation of said output transducer of said first track so that said filter is switchable between said two transmission bands.

* * * * *